US009397661B2

(12) United States Patent
Ha

(10) Patent No.: US 9,397,661 B2
(45) Date of Patent: Jul. 19, 2016

(54) ON-DIE TERMINATION CIRCUIT AND ON-DIE TERMINATION METHOD

(71) Applicant: Samsung Electronics Co., Ltd., Suwon-si, Gyeonggi-do (KR)

(72) Inventor: Kyung-Soo Ha, Hwaseongi-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/742,219

(22) Filed: Jun. 17, 2015

(65) Prior Publication Data

US 2016/0134285 A1    May 12, 2016

(30) Foreign Application Priority Data

Nov. 12, 2014   (KR) .................. 10-2014-0157141

(51) Int. Cl.
*H03K 19/0185* (2006.01)
*H03K 19/00* (2006.01)
*H03K 19/003* (2006.01)

(52) U.S. Cl.
CPC ...... *H03K 19/0005* (2013.01); *H03K 19/00369* (2013.01)

(58) Field of Classification Search
CPC ............................................. H03K 19/017545
USPC ................................ 326/30, 86, 21; 327/108
See application file for complete search history.

(56) References Cited

U.S. PATENT DOCUMENTS

| 6,456,124 | B1 | 9/2002 | Lee et al. |
| 7,839,159 | B2 | 11/2010 | Nakamura et al. |
| 7,859,296 | B2 | 12/2010 | Kim et al. |
| 7,893,710 | B2 | 2/2011 | Lee |
| 8,067,956 | B2 | 11/2011 | Lee |
| 8,344,751 | B2 | 1/2013 | Cho |
| 2008/0079458 | A1* | 4/2008 | Shin ............ H03K 19/00384 326/30 |

FOREIGN PATENT DOCUMENTS

| KR | 10-0893579 B1 | 4/2009 |
| KR | 10-2010-0003602 A | 1/2010 |

* cited by examiner

*Primary Examiner* — Daniel D Chang
(74) *Attorney, Agent, or Firm* — Harness, Dickey & Pierce, P.L.C.

(57) ABSTRACT

An ODT circuit capable of generating an OCD/ODT code and/or a reference voltage adaptively adjusted according to a system environment is disclosed. The ODT circuit comprises a system environment detector, an OCD/ODT replica circuit, an OCD/ODT code generator and an OCD/ODT unit. The system environment detector detects a supply voltage to generate a voltage code, detects an operating temperature to generate a temperature code, and detects an operating frequency to generate a frequency code. The OCD/ODT code generator generates a pull-up code and a pull-down code currently optimized for a semiconductor memory device based on a pull-up reference voltage, a pull-down reference voltage, the voltage code, the temperature code and the frequency code.

20 Claims, 15 Drawing Sheets

ON-DIE TERMINATION CIRCUIT AND ON-DIE TERMINATION METHOD

CROSS-REFERENCE TO RELATED APPLICATION

This application claims priority under 35 U.S.C. §119 to Korean Patent Application No. 10-2014-0157141 filed on Nov. 12, 2014 the subject matter of which is hereby incorporated by reference.

BACKGROUND

Example embodiments of the inventive concepts generally relate to semiconductor devices. For example, at least some of the example embodiments of the inventive concepts relate to an on-die termination (ODT) circuit and/or an ODT method of a semiconductor device.

A semiconductor memory device may transmit or receive data and control signals through buses to and/or from a memory controller. As the frequency of a signal transmitted between the semiconductor memory device and the memory controller increases, signal distortion may be increased.

To alleviate impedance mismatches and the resulting noise, signal lines of a bus may undergo a "termination" process wherein a resistor and/or another discrete element are provided to better match the impedance of the signal line, thereby preventing or reducing signal distortion.

SUMMARY

Example embodiments of the inventive concepts provide an on-die termination (ODT) circuit capable of generating an on-chip driver (OCD)/ODT code and/or a reference voltage adaptively adjusted according to a system environment including a supply voltage, an operating temperature and/or an operating frequency.

Example embodiments of the inventive concepts also provide an ODT method capable of generating an OCD/ODT code and/or a reference voltage adaptively adjusted according to a system environment including a supply voltage, an operating temperature and/or an operating frequency.

In some example embodiments of the inventive concepts, an ODT circuit includes a system environment detector, an OCD/ODT replica circuit, an OCD/ODT code generator and an OCD/ODT unit.

The system environment detector detects a supply voltage to generate a voltage code, detects an operating temperature to generate a temperature code, and detects an operating frequency to generate a frequency code. The OCD/ODT replica circuit generates a pull-up reference voltage and a pull-down reference voltage. The OCD/ODT code generator generates a pull-up code and a pull-down code currently optimized for a semiconductor memory device based on the pull-up reference voltage, the pull-down reference voltage, the voltage code, the temperature code and the frequency code. The OCD/ODT unit changes ODT resistance in response to the pull-up code and the pull-down code.

In an example embodiment, the system environment detector may include a voltage detecting circuit configured to detect the supply voltage to generate the voltage code, a temperature detecting circuit configured to detect the operating temperature to generate the temperature code, and a frequency detecting circuit configured to detect the operating frequency to generate the frequency code.

In an example embodiment, the voltage detecting circuit may include a reference voltage generator configured to generate a first reference voltage and a second reference voltage, a voltage divider configured to divide the supply voltage to generate a first voltage, a first comparator configured to compare the first voltage with the first reference voltage, a second comparator configured to compare the first voltage with the second reference voltage, and a decoder configured to decode an output voltage of the first comparator and an output of the second comparator to generate the voltage code.

In an example embodiment, the voltage code may include a first voltage code having a voltage level greater than a first supply voltage, a second voltage code having a voltage level greater than or equal to a second supply voltage and smaller than or equal to the first supply voltage, and a third voltage code having a voltage level smaller than a second supply voltage.

In an example embodiment, the temperature detecting circuit may include a band-gap reference circuit, a first current-controlled oscillator, a second current-controlled oscillator, a first counter and a second counter.

The band-gap reference circuit generates a first sense signal having a voltage level proportional to an absolute temperature and a second sense signal having a voltage level inversely proportional to the absolute temperature. The first current-controlled oscillator generates a first clock signal based on the first sense signal. The second current-controlled oscillator generates a second clock signal based on the second sense signal. The first counter counts the second clock signal to generate a selection signal. The second counter counts the first clock signal to generate the temperature code in response to the selection signal.

In an example embodiment, the first current-controlled oscillator may include a voltage-current converting unit configured to generate a first current signal corresponding to the first sense signal, and an oscillating unit configured to generate the first clock signal that oscillates in response to the first current signal.

In an example embodiment, the second current-controlled oscillator may include a voltage-current converting unit configured to generate a second current signal corresponding to the second sense signal, and an oscillating unit configured to generate the second clock signal that oscillates in response to the second current signal.

In an example embodiment, the frequency detecting circuit may include a frequency divider configured to frequency-divide a first clock signal to generate a second clock signal, a gated oscillator configured to generate a third clock signal based on the second clock signal, and a counter and decoder configured to count and decode the third clock signal to generate the frequency code.

In an example embodiment, the OCD/ODT code generator may include an OCD/ODT code generating unit and a code adjusting circuit.

The OCD/ODT code generating unit generates an initial code based on the pull-up reference voltage, the pull-down reference voltage, the voltage code, the temperature code and the frequency code, and generates the pull-up code and the pull-down code based on an adjusted code. The code adjusting circuit generates the adjusted code based on the initial code, the voltage code, the temperature code and the frequency code, and provides the adjusted code to the OCD/ODT code generating unit.

In an example embodiment, the code adjusting circuit may include an adder, a subtractor and a selecting circuit.

The adder performs an addition operation on the initial code and a compensation code to generate a first output signal. The subtractor performs a subtraction operation on the initial code and the compensation code to generate a second output signal. The selecting circuit selects one of the first output signal and the second output signal in response to the voltage code, the temperature code and the frequency code, and outputs the selected signal as the adjusted code.

In an example embodiment, the code adjusting circuit may include a plurality of code registers and a selecting circuit.

The plurality of code registers stores respective values that are the initial code to which one number between −N and +N has been added. The selecting circuit selects one of the output signals of the code registers in response to the voltage code, the temperature code and the frequency code, and outputs the selected signal as the adjusted code.

In an example embodiment, the OCD/ODT code generator may include an OCD/ODT code generating unit and a code adjusting circuit.

The OCD/ODT code generating unit generates an initial code based on the pull-up reference voltage, the pull-down reference voltage, the voltage code, the temperature code and the frequency code. The code adjusting circuit generates the pull-up code and the pull-down code currently optimized for the semiconductor memory device based on the initial code, the voltage code, the temperature code and the frequency code.

In other example embodiments of the inventive concepts, an ODT circuit includes a system environment detector, an OCD/ODT replica circuit, an OCD/ODT code generator, an OCD/ODT unit, an input/output (I/O) pad, a reference voltage generator and a comparator.

The system environment detector detects a supply voltage to generate a voltage code, detects an operating temperature to generate a temperature code, and detects an operating frequency to generate a frequency code. The OCD/ODT replica circuit generates a pull-up reference voltage and a pull-down reference voltage. The OCD/ODT code generator generates a pull-up code and a pull-down code currently optimized for a semiconductor memory device based on the pull-up reference voltage, the pull-down reference voltage, the voltage code, the temperature code and the frequency code. The OCD/ODT unit changes ODT resistance in response to the pull-up code and the pull-down code. The I/O pad is connected to the OCD/ODT unit. The reference voltage generator generates a reference voltage currently optimized for a semiconductor memory device based on the voltage code, the temperature code and the frequency code. The comparator compares a first input received from the I/O pad with the reference voltage to generate a second input signal.

In an example embodiment, the second input signal may include data, an address or a command.

In an example embodiment, a voltage level of the reference voltage may be changed according to a swing level of output data when an ODT resistance of the ODT circuit is changed.

Other example embodiments of the inventive concepts relate to an ODT method.

In some example embodiments, the method includes detecting a supply voltage to generate a voltage code; detecting an operating temperature to generate a temperature code; detecting an operating frequency to generate a frequency code; generating a pull-up reference voltage and a pull-down reference voltage; generating a pull-up code and a pull-down code currently optimized for a semiconductor memory device based on the pull-up reference voltage, the pull-down reference voltage, the voltage code, the temperature code and the frequency code; and changing ODT resistance in response to the pull-up code and the pull-down code.

In an example embodiment, the generating of the voltage code may include generating a first reference voltage and a second reference voltage; dividing the supply voltage to generate a first voltage; comparing the first voltage with the first reference voltage; comparing the first voltage with the second reference voltage; and decoding an output voltage of the first comparator and an output of the second comparator to generate the voltage code.

In an example embodiment, the generating of the temperature code may include generating a first sense signal having a voltage level proportional to an absolute temperature and a second sense signal having a voltage level inversely proportional to the absolute temperature; generating a first clock signal based on the first sense signal; generating a second clock signal based on the second sense signal; counting the second clock signal to generate a selection signal; and counting the first clock signal to generate the temperature code in response to the selection signal.

In an example embodiment, the generating of the frequency code may include frequency-dividing a first clock signal to generate a second clock signal; generating a third clock signal based on the second clock signal; and counting and decoding the third clock signal to generate the frequency code.

In an example embodiment, the generating of a pull-up code and a pull-down code currently optimized for a semiconductor memory device may include generating an initial code based on the pull-up reference voltage, the pull-down reference voltage, the voltage code, the temperature code and the frequency code; generating the adjusted code based on the initial code, the voltage code, the temperature code and the frequency code; and generating the pull-up code and the pull-down code based on an adjusted code.

The ODT circuit according to example embodiments of the inventive concepts may be configured to adaptively adjust a code to control ODT resistance according to a system environment including a supply voltage, an operating temperature and/or an operating frequency. Further the ODT circuit may adjust a voltage level of the reference voltage according to a swing level of output data when a system environment including a supply voltage, an operating temperature and an operating frequency is changed.

In other example embodiments, the ODT circuit may be configured to compensate for impedance mismatch and increase a driving capability of a data signal by providing a termination impedance based on the impedance mismatch.

In some example embodiments, the ODT circuit may include one or more detector circuits configured to detect one or more environmental variables of the ODT circuit; an input/output (I/O) pad configured to receive or transmit the data signal; and a control circuit configured to adjust the termination impedance based on the environmental variables.

In some example embodiments, the environmental variables include a supply voltage, an operating temperature, and an operating frequency.

In some example embodiments the control circuit may include a code generator configured to generate a pull-up code and a pull-down code based on reference voltages and the environmental variables.

In some example embodiments, the control circuit may include an impedance adjusting device configured to selectively connect the I/O pad to a pull up circuit and a pull down circuit based on the pull-up code, the pull-down code and the data signal.

In some example embodiments the I/O pad is coupled to one or more of an internal bus line and an external bus line, and the control circuit is configured to change a termination resistance of one or more of the internal bus line and the external bus line based on the environmental conditions.

Therefore, the ODT circuit may perform impedance compensation more accurately and stably even if the supply voltage, the operating temperature and the operating frequency are changed.

BRIEF DESCRIPTION OF THE DRAWINGS

The foregoing and other features and advantages of the example embodiments of the inventive concepts will become more apparent upon consideration of certain example embodiments of the inventive concepts illustrated in the accompanying drawings. The drawings are not necessarily to scale, but emphasize certain features and principles of the example embodiments of the inventive concepts. Throughout the drawings and written description, like reference numbers and labels are used to denote like or similar elements and features. In the drawings.

DETAILED DESCRIPTION

Figure 1:
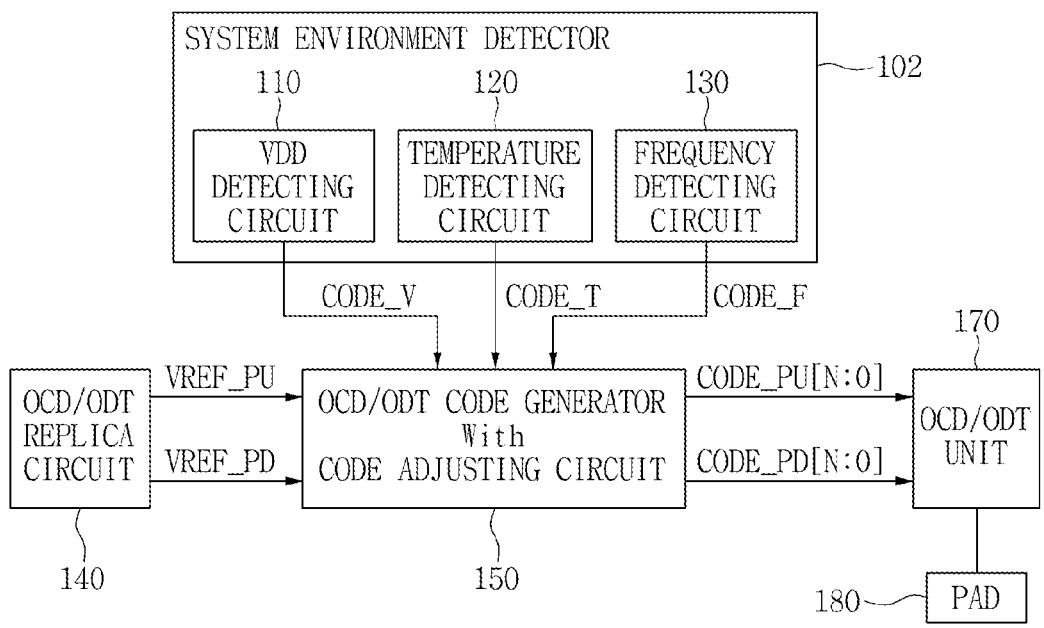
FIG. 1 is a block diagram of an on-die termination (ODT) circuit in accordance with an example embodiment of the inventive concepts.

Certain example embodiments of the inventive concepts will now be described in some additional detail with reference to the accompanying drawings. These inventive concepts may, however, be embodied in different forms and should not be construed as being limited to only the illustrated example embodiments. Rather, these example embodiments are provided so that this disclosure is thorough and complete and fully conveys the example embodiments of the inventive concepts to those skilled in the art.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments of the inventive concepts.

The terminology used herein is for the purpose of describing particular embodiments only and is not intended to be limiting of the example embodiments of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The on-die termination (ODT) circuit compensates for impedance and increases a driving capability of a signal when a semiconductor memory device receives data from exterior. In contrast, a circuit that compensates for impedance and increases a driving capability of a signal when a semiconductor memory device transmits data to the exterior is called an on-chip driver (OCD) circuit. However, in this specification, the ODT circuit is defined to include the OCD circuit.

FIG. 1 is a block diagram of an ODT circuit 100 in accordance with an example embodiment of the inventive concepts.

Referring to FIG. 1, the ODT circuit 100 may include a system environment detector 102, an OCD/ODT replica circuit 140, an OCD/ODT code generator 150 and an OCD/ODT unit 170. The OCD/ODT unit 170 may be connected to an input/output (I/O) pad 180. The OCD/ODT replica circuit 140, the OCD/ODT code generator 150 and the OCD/ODT unit 170 may collectively constitute a control circuit.

The system environment detector 102 detects a supply voltage VDD to generate a voltage code CODE_V, detects an operating temperature to generate a temperature code CODE_T, and detects an operating frequency to generate a frequency code CODE_F. The OCD/ODT replica circuit 140 generates a pull-up reference voltage VREF_PU and a pull-down reference voltage VREF_PD. The OCD/ODT code generator 150 generates a pull-up code CODE_PU[N:0] and a pull-down code CODE_PD[N:0] currently optimized for a semiconductor memory device based on the pull-up reference voltage VREF_PU, the pull-down reference voltage VREF_PD, the voltage code CODE_V, the temperature code CODE_T and the frequency code CODE_F. The OCD/ODT unit 170 changes ODT resistance in response to the pull-up code CODE_PU[N:0] and the pull-down code CODE_PD[N:0].

The system environment detector 102 may include a voltage detecting circuit 110 configured to detect the supply voltage to generate the voltage code CODE_V, a temperature detecting circuit 120 configured to detect the operating temperature to generate the temperature code CODE_T, and a frequency detecting circuit 130 configured to detect the operating frequency to generate the frequency code CODE_F.

Figure 2:
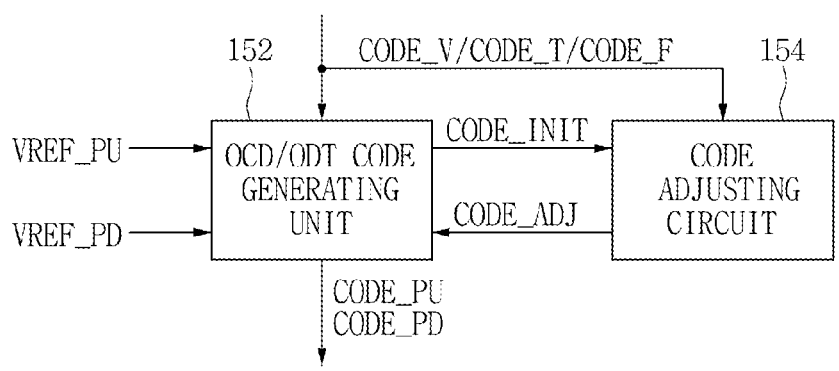
FIG. 2 is a block diagram of an on-chip driver (OCD)/ODT code generator included in the ODT circuit of FIG. 1 in accordance with an example embodiment of the inventive concepts.

FIG. 2 is a block diagram of an OCD/ODT code generator 150 included in the ODT circuit of FIG. 1 in accordance with an example embodiment of the inventive concepts.

Referring to FIG. 2, the OCD/ODT code generator 150 may include an OCD/ODT code generating unit 152 and a code adjusting circuit 154.

The OCD/ODT code generating unit 152 generates an initial code CODE_INIT based on the pull-up reference voltage VREF_PU, the pull-down reference voltage VREF_PD, the voltage code CODE_V, the temperature code CODE_T and the frequency code CODE_F, and generates the pull-up code CODE_PU[N:0] and the pull-down code CODE_PD[N:0] based on an adjusted code CODE_ADJ. The code adjusting circuit 154 generates the adjusted code CODE_ADJ based on the initial code CODE_INIT, the voltage code CODE_V, the temperature code CODE_T and the frequency code CODE_F, and provides the adjusted code CODE_ADJ to the OCD/ODT code generating unit 152.

Figure 3:
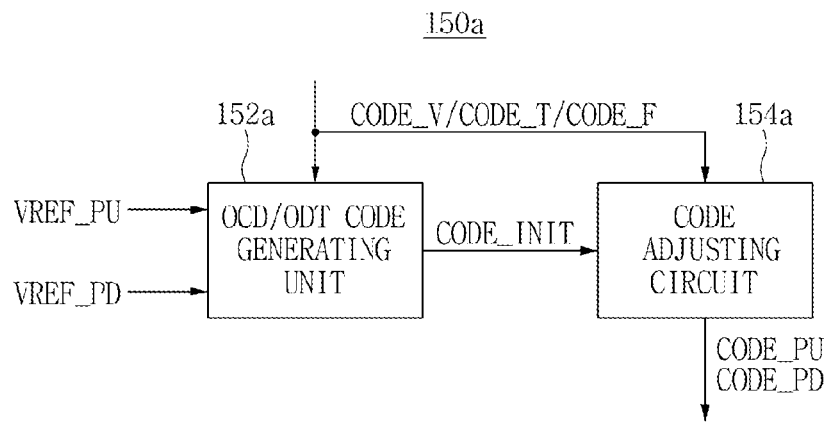
FIG. 3 is a block diagram of an OCD/ODT code generator included in the ODT circuit of FIG. 1 in accordance with another example embodiment of the inventive concepts.

FIG. 3 is a block diagram of an OCD/ODT code generator 150a included in the ODT circuit of FIG. 1 in accordance with another example embodiment of the inventive concepts.

Referring to FIG. 3, the OCD/ODT code generator 150a may include an OCD/ODT code generating unit 152a and a code adjusting circuit 154a.

The OCD/ODT code generating unit 152a generates an initial code CODE_INIT based on the pull-up reference voltage VREF_PU, the pull-down reference voltage VREF_PD, the voltage code CODE_V, the temperature code CODE_T and the frequency code CODE_F. The code adjusting circuit 154a generates the pull-up code CODE_PU and the pull-down code CODE_PD currently optimized for a semiconductor memory device based on the initial code CODE_INIT, the voltage code CODE_V, the temperature code CODE_T and the frequency code CODE_F.

Figure 4:
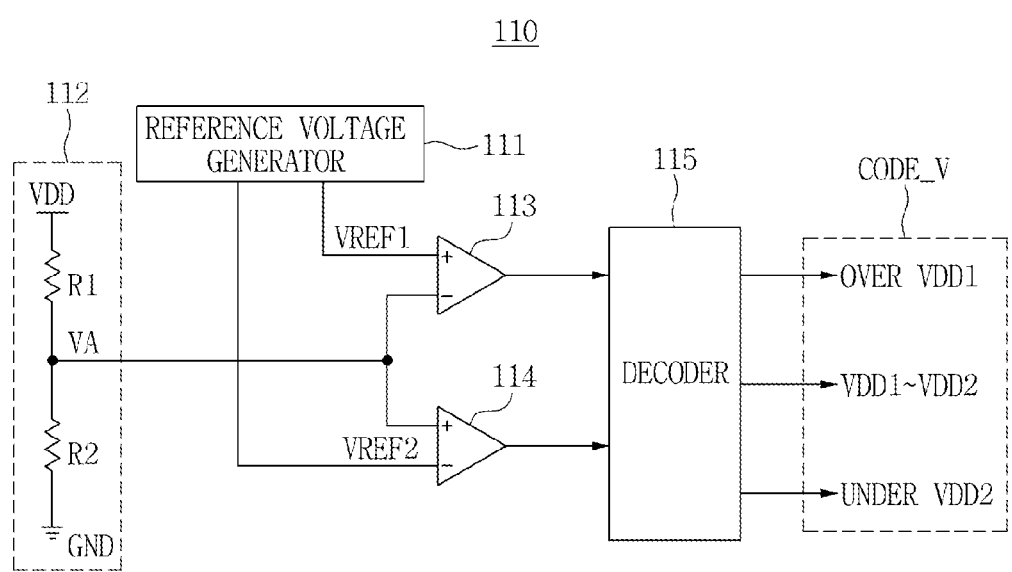
FIG. 4 is a circuit diagram of a voltage detecting circuit included in the ODT circuit of FIG. 1 in accordance with an example embodiment of the inventive concepts.

FIG. 4 is a circuit diagram of a voltage detecting circuit 110 included in the ODT circuit of FIG. 1 in accordance with an example embodiment of the inventive concepts.

Referring to FIG. 4, the voltage detecting circuit 110 may include a reference voltage generator 111 configured to generate a first reference voltage VREF1 and a second reference voltage VREF2, a voltage divider 112 configured to divide the supply voltage VDD to generate a first voltage VA, a first comparator 113 configured to compare the first voltage VA with the first reference voltage VREF1, a second comparator 114 configured to compare the first voltage VA with the second reference voltage VREF2, and a decoder 15 configured to decode an output voltage of the first comparator 113 and an output of the second comparator 114 to generate the voltage code CODE_V. The voltage divider 112 may include resistors R1 and R2 serially connected between the supply voltage VDD and the ground voltage GND.

The voltage code CODE_V may include a first voltage code having a voltage level greater than a first supply voltage VDD1, a second voltage code having a voltage level greater than or equal to a second supply voltage VDD2 and smaller than or equal to the first supply voltage VDD1, and a third voltage code having a voltage level smaller than a second supply voltage VDD2.

Figure 5:
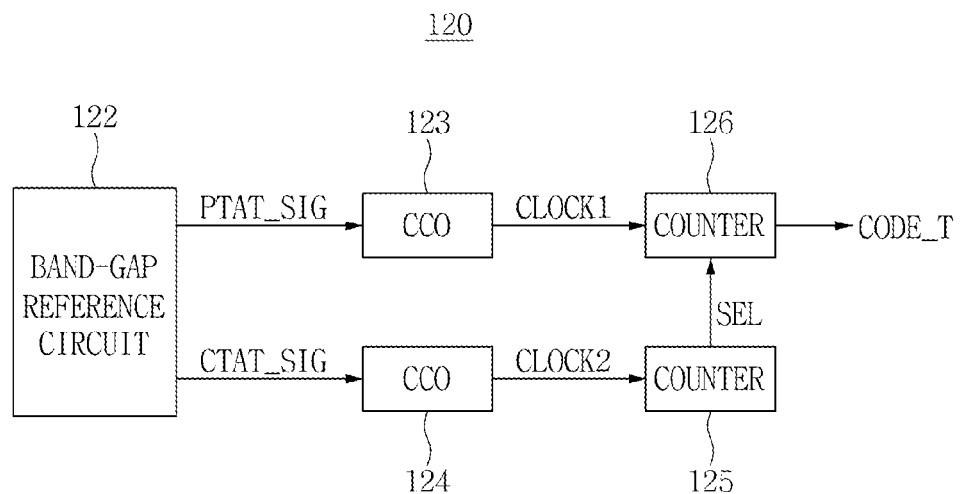
FIG. 5 is a block diagram of a temperature detecting circuit included in the ODT circuit of FIG. 1 in accordance with an example embodiment of the inventive concepts.

FIG. 5 is a block diagram of a temperature detecting circuit 120 included in the ODT circuit of FIG. 1 in accordance with an example embodiment of the inventive concepts.

Referring to FIG. 5, the temperature detecting circuit 120 may include a band-gap reference circuit 122, a first current-controlled oscillator 123, a second current-controlled oscillator 124, a first counter 125 and a second counter 126.

The band-gap reference circuit 122 generates a first sense signal PTAT_SIG having a voltage level proportional to an absolute temperature and a second sense signal CTAT_SIG having a voltage level inversely proportional to the absolute temperature. The first current-controlled oscillator 123 generates a first clock signal CLOCK1 based on the first sense signal PTAT_SIG. The second current-controlled oscillator 124 generates a second clock signal CLOCK2 based on the second sense signal CTAT_SIG. The first counter 125 counts the second clock signal CLOCK2 to generate a selection signal SEL. The second counter 126 counts the first clock signal CLOCK1 to generate the temperature code CODE_T in response to the selection signal SEL.

Figure 6:
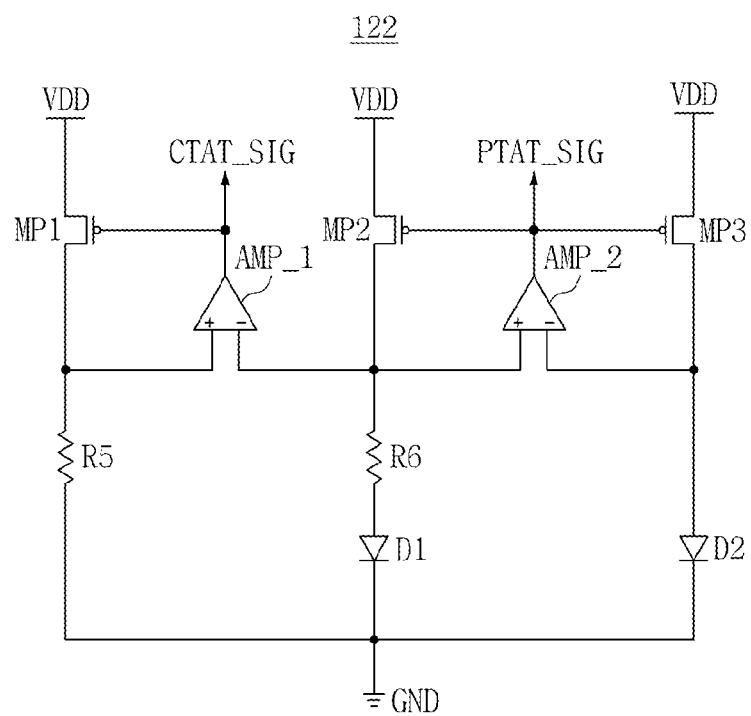
FIG. 6 is a circuit diagram of an embodiment of a band-gap reference circuit included in the temperature detecting circuit of FIG. 5.

FIG. 6 is a circuit diagram of an example embodiment of a band-gap reference circuit 122 included in the temperature detecting circuit of FIG. 5.

Referring to FIG. 6, the band-gap reference circuit 122 may include PMOS transistors MP1, MP2 and MP3, differential amplifiers AMP_1 and AMP_2, resistors R5 and R6, and diodes D1 and D2. The band-gap reference circuit 122 may output the first sense signal PTAT_SIG and the second sense signal CTAT_SIG from output terminals of the amplifiers AMP_1 and AMP_2.

Figure 7:
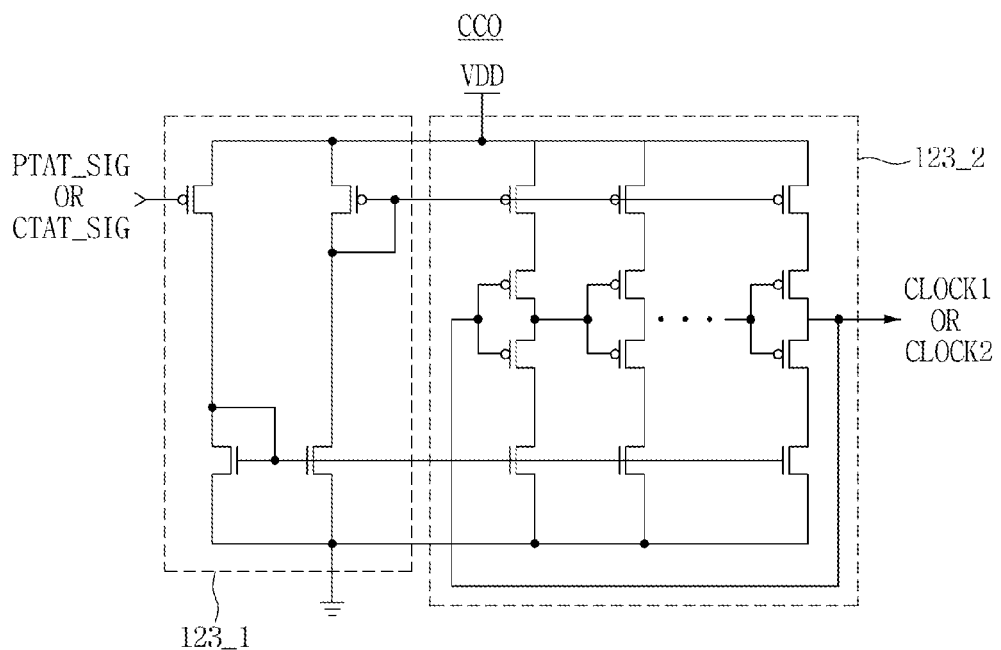
FIG. 7 is a circuit diagram of an embodiment of a current-controlled oscillator included in the temperature detecting circuit of FIG. 5.

FIG. 7 is a circuit diagram of an example embodiment of a current-controlled oscillator CCO included in the temperature detecting circuit of FIG. 5.

Referring to FIG. 7, the current-controlled oscillator CCO may include a voltage-current converting unit 123_1 and an oscillating unit 123_2. The voltage-current converting unit 123_1 may include PMOS transistors and NMOS transistors, and the NMOS transistors may be connected in a current-mirror form. The oscillating unit 123_2 may have a structure in which inverters each including a PMOS transistor and an NMOS transistor connected in series are connected in a chain form, and may generate an oscillating signal.

The voltage-current converting unit 123_1 may be configured to generate a first current signal corresponding to the first sense signal PTAT_SIG, and the oscillating unit 123_2 may be configured to generate the first clock signal CLOCK1 that oscillates in response to the first current signal.

Although not illustrated, the second current-controlled oscillator 124 may include a voltage-current converting unit configured to generate a second current signal corresponding to the second sense signal CTAT_SIG, and an oscillating unit configured to generate the first clock signal CLOCK1 that oscillates in response to the second current signal (not shown).

Figure 8:
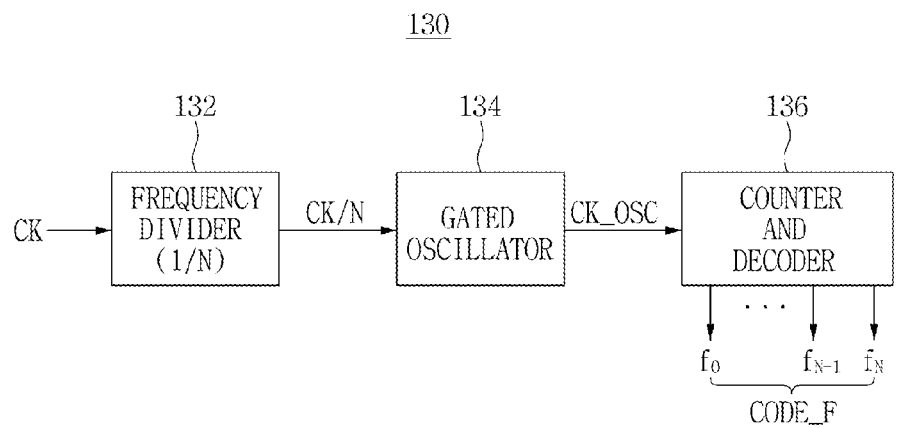
FIG. 8 is a block diagram of a frequency detecting circuit included in the ODT circuit of FIG. 1 in accordance with an example embodiment of the inventive concepts.

FIG. 8 is a block diagram of a frequency detecting circuit 130 included in the ODT circuit of FIG. 1 in accordance with an example embodiment of the inventive concepts.

Referring to FIG. 8, the frequency detecting circuit 130 may include a frequency divider 132 configured to frequency-divide a first clock signal CK to generate a second clock signal CK/N, a gated oscillator 134 configured to generate a third clock signal CK_OSC based on the second clock signal CK/N, and a counter and decoder 136 configured to count and decode the third clock signal CK_OSC to generate the frequency code CODE_F.

Figure 9:
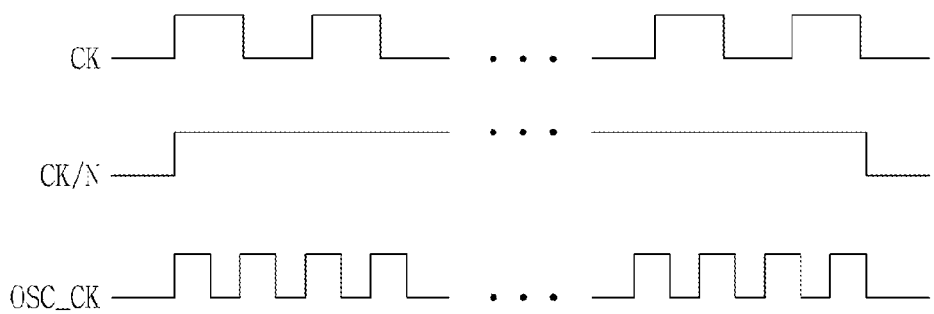
FIG. 9 is a timing diagram illustrating an operation of the frequency detecting circuit of FIG. 8.

FIG. 9 is a timing diagram illustrating an operation of the frequency detecting circuit of FIG. 8.

Referring to FIG. 9, the second clock signal CK/N may have a frequency of 1/N of the first clock signal CK, and the third clock signal CK_OSC may have a higher frequency than the first clock signal CK.

Figure 10:
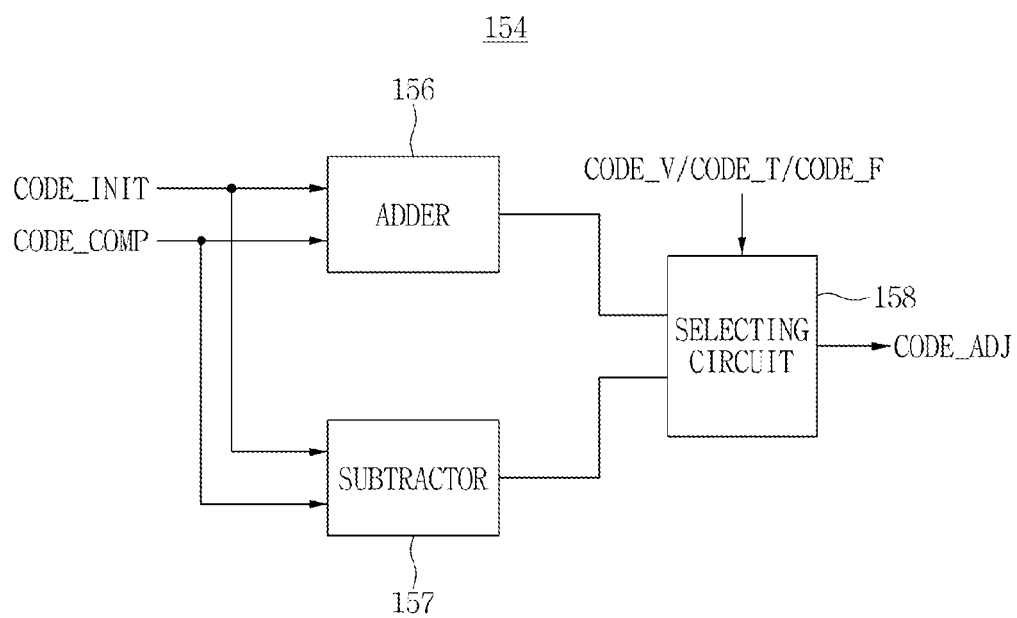
FIG. 10 is a block diagram of an embodiment of a code adjusting circuit included in the OCD/ODT code generator of FIG. 2.

FIG. 10 is a block diagram of an example embodiment of a code adjusting circuit 154 included in the OCD/ODT code generator 150 of FIG. 2.

Referring to FIG. 10, the code adjusting circuit 154 may include an adder 156, a subtractor 157 and a selecting circuit 158.

The adder 156 performs an addition operation on the initial code CODE_INIT and a compensation code CODE_COMP to generate a first output signal. The subtractor 157 performs a subtraction operation on the initial code CODE_INIT and the compensation code CODE_COMP to generate a second output signal. The selecting circuit 158 selects one of the first output signal and the second output signal in response to the voltage code CODE_V, the temperature code CODE_T and the frequency code CODE_F, and outputs the selected signal as the adjusted code CODE_ADJ.

Figure 11:
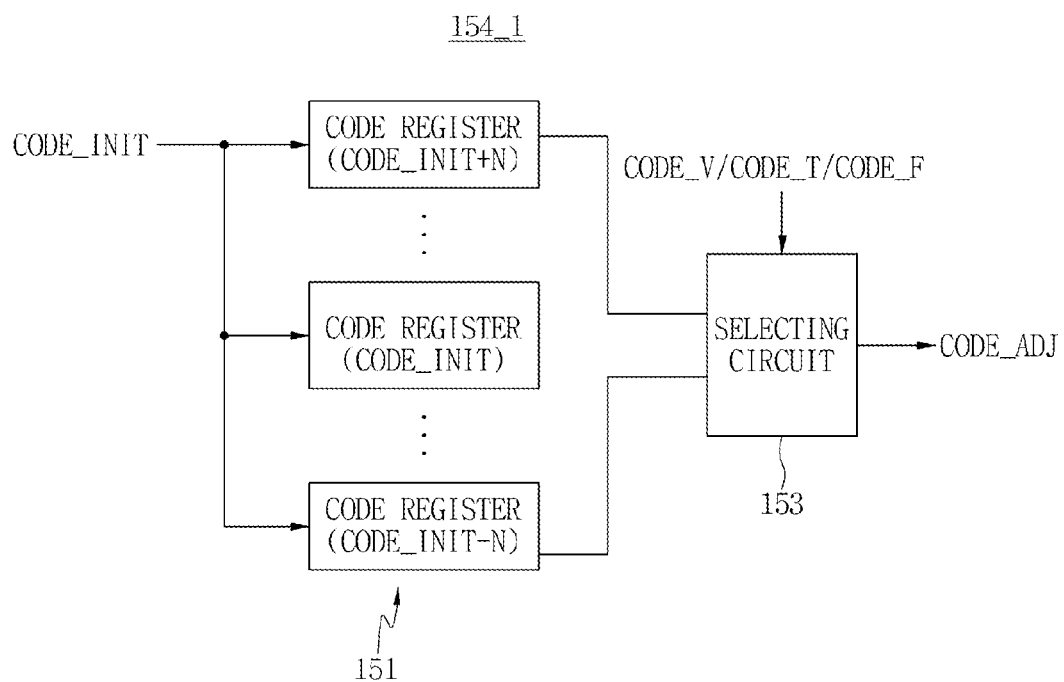
FIG. 11 is a block diagram of another embodiment of a code adjusting circuit included in the OCD/ODT code generator of FIG. 2.

FIG. 11 is a block diagram of another example embodiment of a code adjusting circuit 154_1 included in the OCD/ODT code generator 150 of FIG. 2.

Referring to FIG. 11, the code adjusting circuit 154_1 may include a plurality of code registers 151 and a selecting circuit 153.

The plurality of code registers 151 store respective values that are the initial code to which one number between −N and +N has been added. The selecting circuit 153 selects one of the output signals of the code registers 151 in response to the voltage code CODE_V, the temperature code CODE_T and the frequency code CODE_F, outputs the selected signal as the adjusted code CODE_ADJ, and outputs the selected signal as the adjusted code CODE_ADJ.

Figure 12:
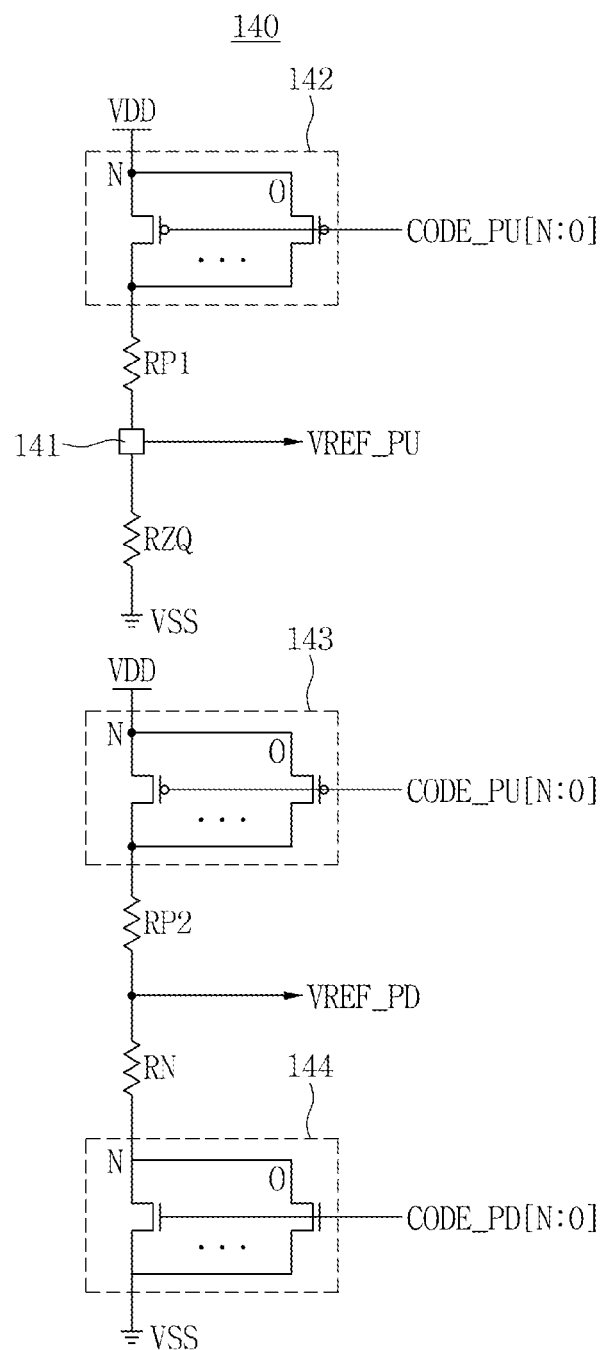
FIG. 12 is a block diagram of an OCD/ODT replica circuit included in the ODT circuit of FIG. 1 in accordance with an example embodiment of the inventive concepts.

FIG. 12 is a block diagram of an OCD/ODT replica circuit 140 included in the ODT circuit of FIG. 1 in accordance with an example embodiment of the inventive concepts.

Referring to FIG. 12, the OCD/ODT replica circuit 140 may include pull-up transistors 142 including PMOS transistors connected in parallel to each other and connected to the supply voltage VDD that operate in response to the pull-up code CODE_PU, a first resistor RP1 connected between the pull-up transistors 142 and a pad 141, and a ZQ resistor RZQ connected between the pad 141 and the ground voltage VSS. The pull-up reference voltage VREF_PU may be output at the pad 141. Further, the OCD/ODT replica circuit 140 may include pull-up transistors 143 including PMOS transistors connected in parallel to each other and connected to the supply voltage VDD that operate in response to the pull-up code CODE_PU, a second resistor RP2 connected to the pull-up transistors 143, a third resistor RN connected to the second resistor RP2, and pull-down transistors 144 including NMOS transistors connected in parallel to each other and connected to the ground voltage VSS that operate in response to the pull-down code CODE_PD.

Figure 13:
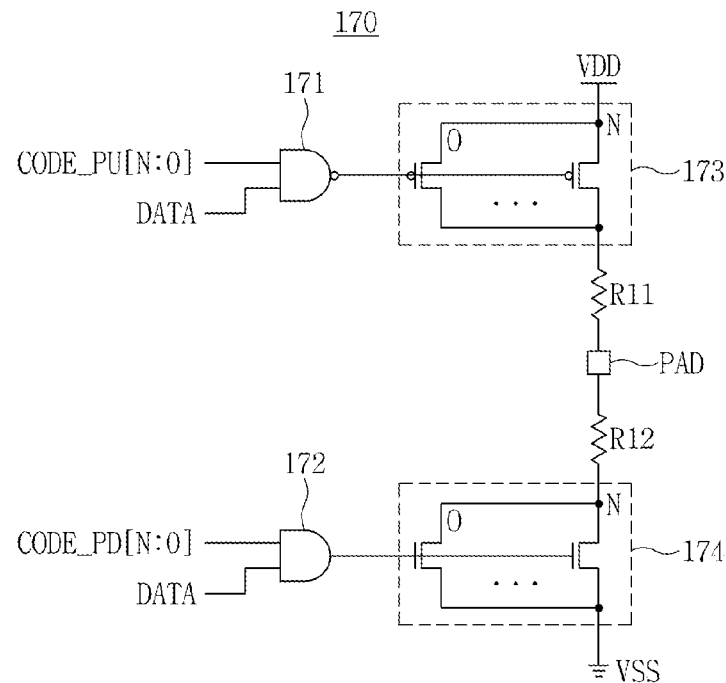
FIG. 13 is a block diagram of an OCD/ODT unit included in the ODT circuit of FIG. 1 in accordance with an example embodiment of the inventive concepts.

FIG. 13 is a block diagram of an OCD/ODT unit 170 included in the ODT circuit of FIG. 1 in accordance with an example embodiment of the inventive concepts.

Referring to FIG. 13, the OCD/ODT unit 170 may include a NAND gate 171 that performs a NAND operation on the pull-up code CODE_PU and data DATA, pull-up transistors 173 including PMOS transistors connected in parallel to each other and connected to an output terminal of the NAND gate 171 and the supply voltage VDD, a first resistor R11 connected between the pull-up transistors 173 and a pad PAD, a second resistor R12 connected to the pad PAD, an AND gate 172 that performs an AND operation on the pull-down code CODE_PD and the data DATA, and pull-up transistors 174 including NMOS transistors connected in parallel to each other, connected to an output terminal of the AND gate 172, and connected between the ground voltage VSS and the second resistor R12.

Figure 14:
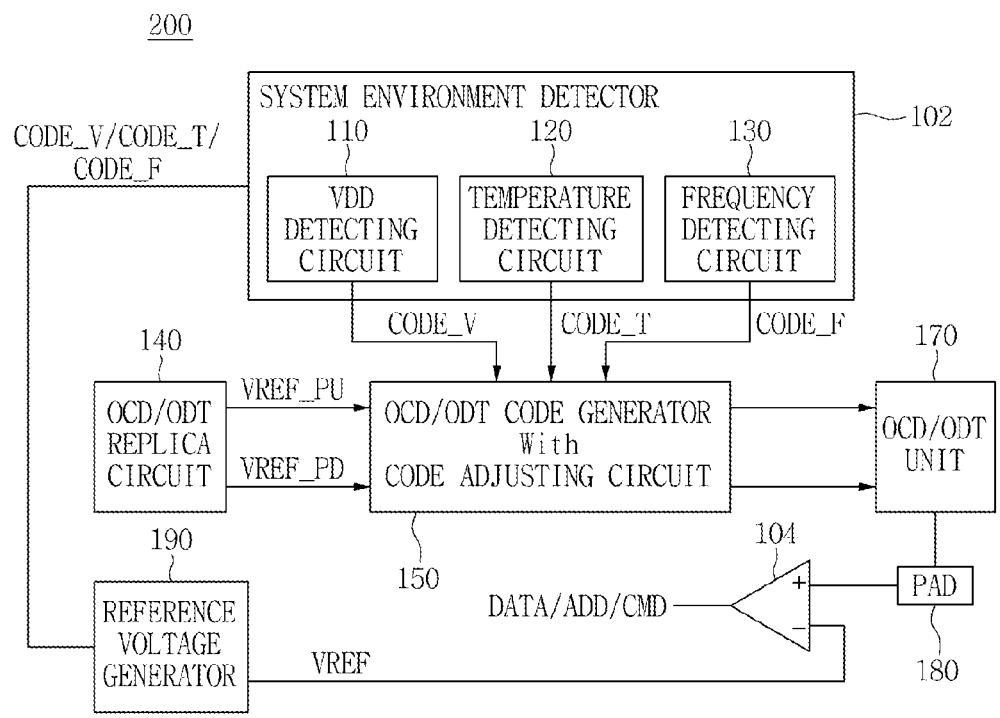
FIG. 14 is a block diagram of an ODT circuit in accordance with another embodiment of the inventive concept.

FIG. 14 is a block diagram of an ODT circuit 200 in accordance with another example embodiment of the inventive concepts.

Referring to FIG. 14, the ODT circuit 200 may include the system environment detector 102, the OCD/ODT replica circuit 140, the OCD/ODT code generator 150, the OCD/ODT unit 170, and the I/O pad 180. The OCD/ODT unit 170 may be connected to the I/O pad 180. Additionally, the ODT circuit 200 of FIG. 14 further includes a reference voltage generator 190 and a comparator 104, as compared to the ODT circuit 100 of FIG. 1.

The reference voltage generator 190 generates a reference voltage VREF automatically (or, alternatively, currently) adjusted (or, alternatively, optimized) for a semiconductor memory device based on the voltage code CODE_V, the temperature code CODE_T and the frequency code CODE_F. The comparator 104 compares a first input received from the I/O pad 180 with the reference voltage VREF to generate a second input signal. The second input signal may include data, an address or a command.

Figure 15:
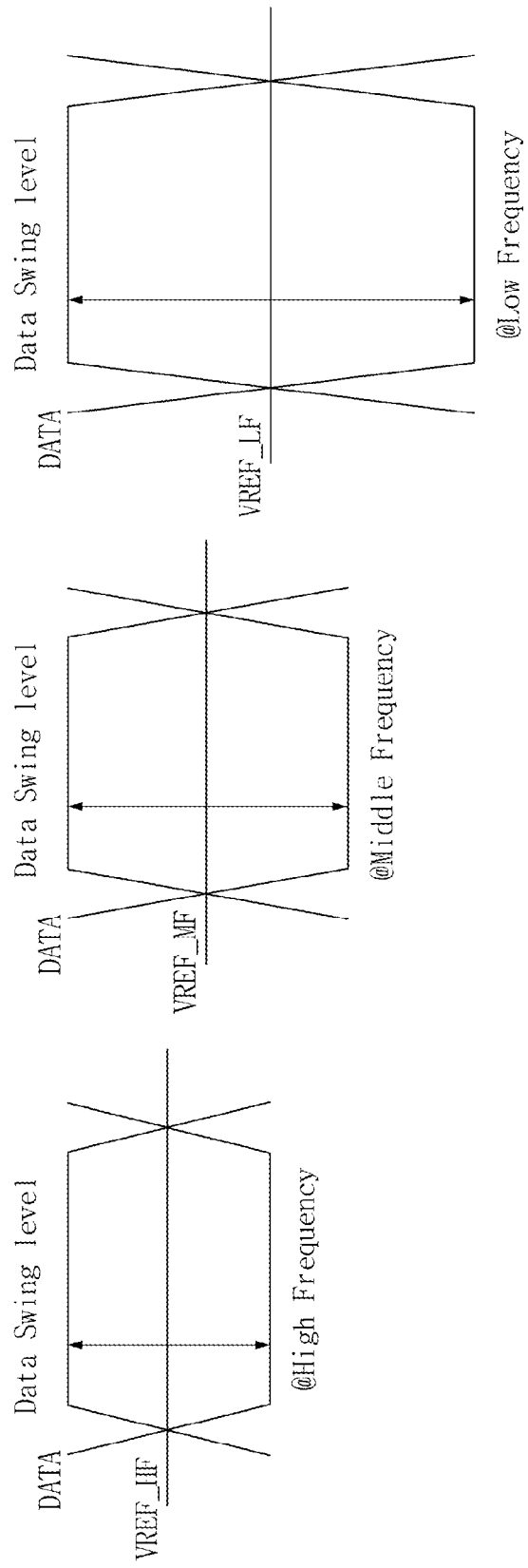
FIG. 15 is a diagram illustrating waveforms of an output signal and a reference voltage of the ODT circuit of FIG. 14.

FIG. 15 is a diagram illustrating waveforms of an output signal and a reference voltage of the ODT circuit 200 of FIG. 14.

As shown in FIG. 15, in the ODT circuit 200 of FIG. 14, a voltage level of the reference voltage may be changed according to a swing level of output data when an ODT resistance of the ODT circuit is changed.

Figure 16:
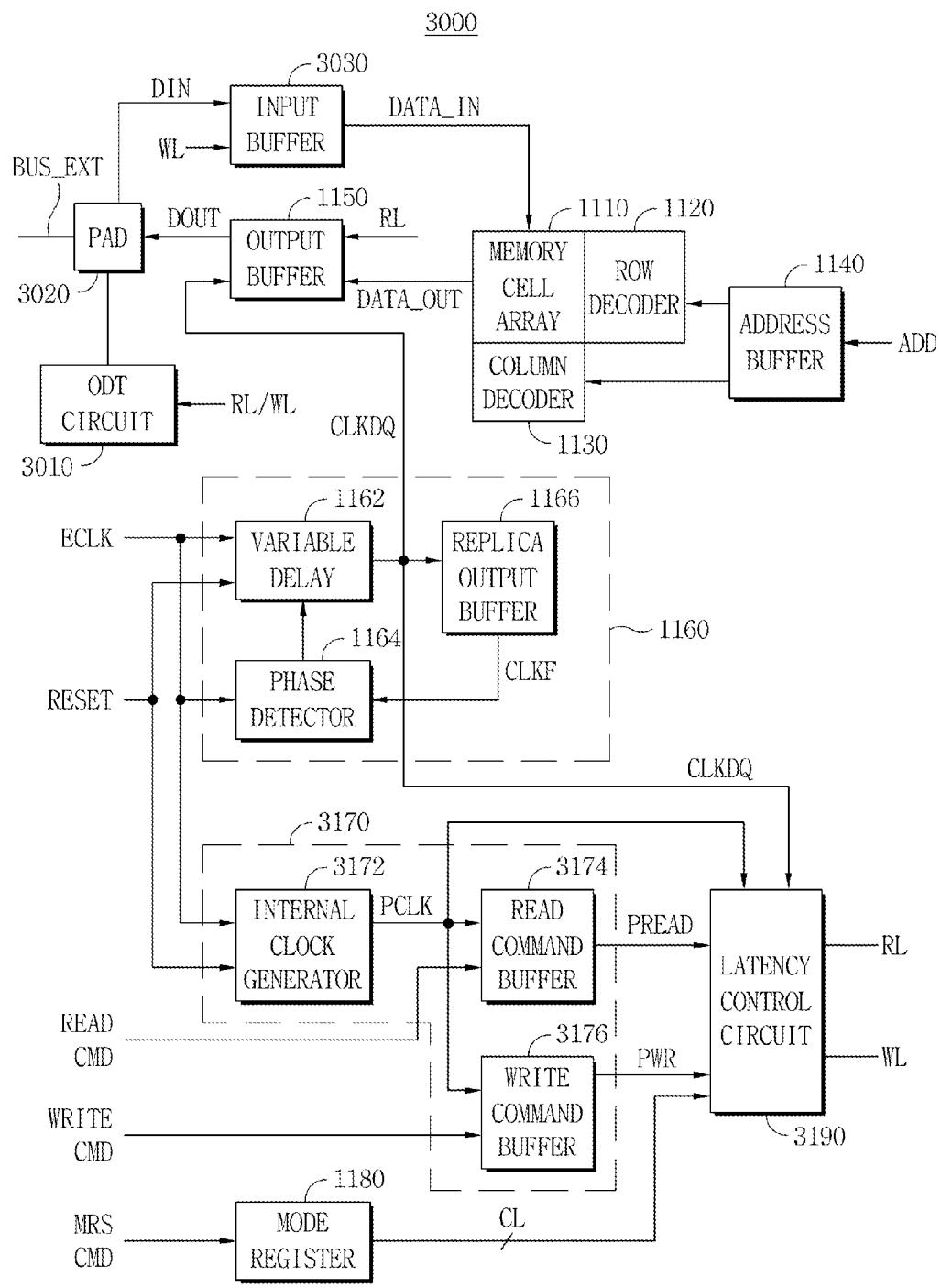
FIG. 16 is a block diagram of a semiconductor memory device including an ODT circuit in accordance with example embodiment of the inventive concepts.

FIG. 16 is a block diagram of a semiconductor memory device 3000 including an ODT circuit in accordance with example embodiments of the inventive concepts.

Referring to FIG. 16, the semiconductor memory device 3000 includes a memory cell array 1110, a row decoder 1120, a column decoder 1130, an address buffer 1140, an output buffer 1150, an input buffer 3030, a clock synchronizing circuit 1160, a command circuit 3170, a mode register 1180, a latency control circuit 3190, an ODT circuit 3010 and a pad 3020.

The clock synchronizing circuit 1160 is a delay-locked-loop (DLL) circuit and may include a variable delay 1162, a phase detector 1164 and a replica output buffer 1166. The command circuit 3170 may include an internal clock generator 3172, a read command buffer 3174 and a write command buffer 3176. The variable delay 1162 may be reset by a reset signal RESET.

Data DATA may be written in the memory cell array 1110 or may be read from the memory cell array 1110 and output to an external circuit. When the read command READ CMD is applied to the semiconductor memory device 3000, the output data DATA_OUT is read from the memory cell array 1110 according to an address ADD received from the external circuit. When the write command WRITE CMD is applied to the semiconductor memory device 3000, the input data DATA_IN is stored in the memory cell array 1110 according to an externally provided address ADD. The address buffer 1140 temporarily stores the address ADD received from the external circuit. The row decoder 1120 receives the address ADD from the address buffer 1140 and decodes the address ADD to generate a row address. The column decoder 1130 receives the address ADD from the address buffer 1140 and decodes the address ADD to generate a column address. The memory cell array 1110 outputs data from the memory cell defined by the row address and the column address. The output buffer 1150 receives data output from the memory cell array 1110, and outputs the received data in response to a read latency control signal RL output from the latency control circuit 3190 and an output clock signal CLKDQ. The input buffer 3030 stores externally provided input data DATA_IN in the memory cell array 1110 in response to a write latency control signal WL output from the latency control circuit 3190.

The clock synchronizing circuit 1160 generates the output clock signal CLKDQ in response to the external clock signal ECLK. The external clock signal ECLK may be used as a reference clock signal for most commands in the semiconductor memory device 1000. That is, most of the commands may be synchronized with the external clock signal ECLK and applied to the semiconductor memory device 3000.

The clock synchronizing circuit 1160 generates the output clock signal CLKDQ that leads in phase compared with the external clock signal ECLK. That is, the output clock signal CLKDQ has the same frequency as the external clock signal ECLK, but pulses of the output clock signal CLKDQ lead pulses of the external clock signal ECLK in phase by a data output time tSAC. Therefore, the clock synchronizing circuit 1160 synchronizes data DOUT output from the output buffer 1150 with the external clock signal ECLK.

The read command circuit 3170 generates the internal clock signal PCLK, the read information signal PREAD and the write information signal PWR based on the read command READ CMD, the write command WRITE CMD and the external clock signal ECLK. The internal clock generator 3172 generates the internal clock signal PCLK based on the external clock signal ECLK, the read command buffer 3174 generates the read information signal PREAD based on the internal clock signal PCLK and the read command READ CMD, and the write command buffer 3176 generates the write information signal PWR based on the internal clock signal PCLK and the write command WRITE CMD. The internal clock generator 3172 may be reset by the reset signal RESET.

The latency control circuit 3190 receives the CAS latency CL from the mode register 1180, and generates the read latency control signal RL and the write latency control signal WL. The output buffer 1150 outputs data in response to the output clock signal CLKDQ while the read latency control signal RL is enabled. The input buffer 3030 inputs data while the write latency control signal WL is enabled.

The latency control circuit 3190 delays a read information signal according to a CAS latency signal and the internal clock signal PCLK to generate a delayed read information signal, and generates a read latency control signal RL based on the delayed read information signal. Further, the latency control circuit 3190 delays a write information signal according to a CAS latency signal and the internal clock signal PCLK to generate a delayed write information signal, and generates a write latency control signal WL based on the delayed write information signal.

The ODT circuit 3010 determines an ODT status based on the read latency control signal RL and write latency control signal WL in order to generate an ODT control signal CON_ODT, and activate/deactivate the ODT section in response to the ODT control signal CON_ODT. The ODT circuit 3010 may be connected to a pad 3020 that is electrically coupled between an external bus BUS_EXT and internal buses BUS_INT1 and BUS_INT2.

Figure 17:
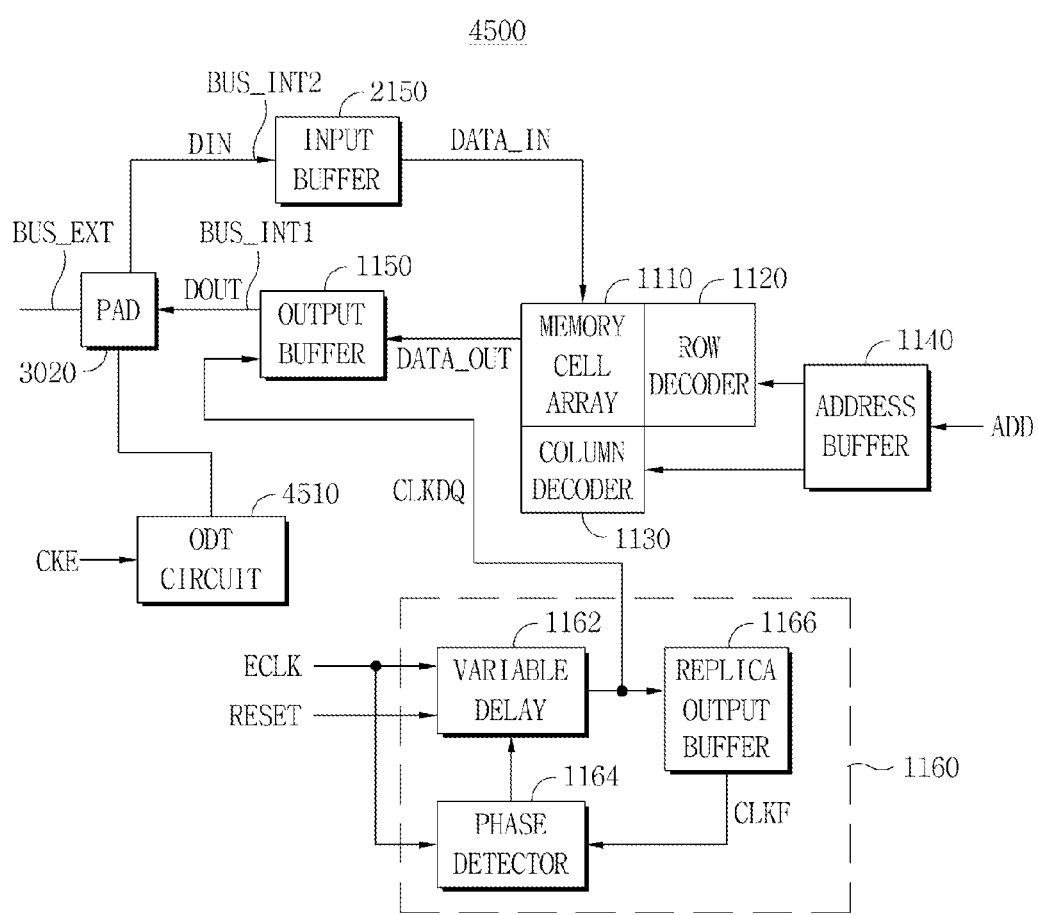
FIG. 17 is a block diagram of a semiconductor memory device including an ODT circuit in accordance with another example embodiment of the inventive concepts.

FIG. 17 is a block diagram of a semiconductor memory device 4500 including an ODT circuit in accordance with another example embodiment of the inventive concepts.

Referring to FIG. 17, the semiconductor memory device 4500 includes a memory cell array 1110, a row decoder 1120, a column decoder 1130, an address buffer 1140, an output buffer 1150, an input buffer 2150, a clock synchronizing circuit 1160, an ODT circuit 4510 and a pad 3020.

The ODT circuit 4510 activates/deactivates a termination resistor in response to the clock enable signal CKE. The ODT circuit 4510 may be electrically connected to the pad 3020.

The clock synchronizing circuit 1160 is a delay-locked-loop (DLL) circuit and may include a variable delay 1162, a phase detector 1164 and a replica output buffer 1166. The variable delay 1162 may be reset by a reset signal RESET.

Data DATA may be written in the memory cell array 1110 or may be read from the memory cell array 1110 and output to an external circuit. When the read command READ CMD is applied to the semiconductor memory device 4500, the data DATA is read from the memory cell array 1110 according to an address ADD received from the external circuit. The address buffer 1140 temporarily stores the address ADD received from the external circuit. The row decoder 1120 receives the address ADD from the address buffer 1140 and decodes the address ADD to generate a row address. The column decoder 1130 receives the address ADD from the address buffer 1140 and decodes the address ADD to generate a column address. The memory cell array 1110 outputs data from the memory cell defined by the row address and the column address. The output buffer 1150 receives data DATA_OUT output from the memory cell array 1110, and outputs the received data in response to an output clock signal CLKDQ. The output data DOUT is output through the pad 3020. The input buffer 2150 buffers input data DIN received from the pad 3020 to generate data DATA_IN and stores it in the memory cell array 1110.

The clock synchronizing circuit 1160 generates the output clock signal CLKDQ in response to the external clock signal ECLK. The external clock signal ECLK may be used as a reference clock signal for most commands in the semiconductor memory device 1000. That is, most of the commands may be synchronized with the external clock signal ECLK and applied to the semiconductor memory device 3000.

The clock synchronizing circuit 1160 generates the output clock signal CLKDQ that leads the external clock signal ECLK in phase. That is, the output clock signal CLKDQ has the same frequency as the external clock signal ECLK, but pulses of the output clock signal CLKDQ lead pulses of the external clock signal ECLK in phase by a data output time tSAC. Therefore, the clock synchronizing circuit 1160 synchronizes data DOUT output from the output buffer 1150 with the external clock signal ECLK.

The semiconductor memory device 4500 of FIG. 17 may include a volatile memory chip such as a dynamic random access memory (DRAM) or a static random access memory (SRAM), a non-volatile memory chip such as a flash memory, a phase change memory, a magnetic random access memory (MRAM), or a resistive random access memory (RRAM), or a combination thereof.

Figure 18:
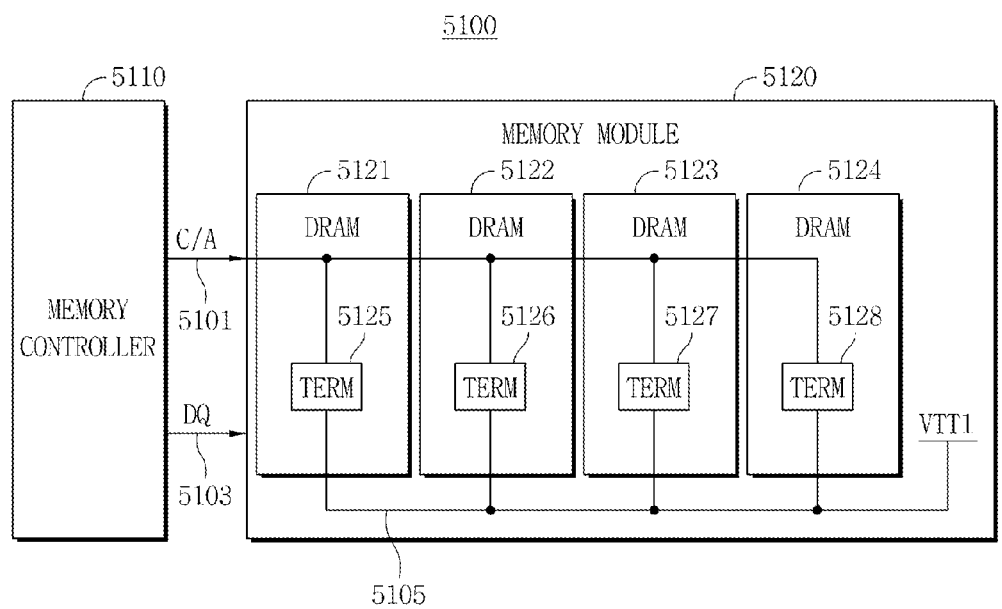
FIG. 18 is a block diagram of a memory system in accordance with an example embodiment of the inventive concepts.

FIG. 18 is a block diagram of a memory system 5100 in accordance with an example embodiment of the inventive concepts.

Referring to FIG. 18, the memory system 5100 generally includes a memory controller 5110 and a memory module 5120.

The memory controller 5110 generates a command/address signal C/A and a data signal DQ. The memory module 5120 operates in response to the command/address signal C/A and the data signal DQ. A plurality of semiconductor memory devices 5121, 5122, 5123 and 5124 are mounted on the memory module 5120. Each of the semiconductor memory devices 5121, 5122, 5123 and 5124 has a termination circuit 5125, 5126, 5127 or 5128 for a command/address bus 5101 through which the command/address signal C/A is transmitted. The command/address signal C/A may be packet data in which a command signal and an address signal are coupled in a packet form.

The memory module 5120 having four semiconductor memory devices is shown in FIG. 18, but the memory module 5120 may have two semiconductor memory devices or more. Further, semiconductor memory devices may be mounted on both sides of a substrate of the memory module 5120.

The data signal DQ is transmitted or received between the memory controller 5110 and the semiconductor memory devices 5121, 5122, 5123 and 5124 constituting the memory module 5120 through a data bus 5103.

The command/address bus 5101 has a so-called "fly-by structure," and electrically connects the semiconductor memory devices 5121, 5122, 5123 and 5124 to each other. Further, each of the termination circuit 5125, 5126, 5127 and 5128 included in the semiconductor memory devices 5121, 5122, 5123 and 5124 is coupled between the command/address bus 5101 and a termination voltage VTT, and changes a termination resistance of the command/address bus 5101.

Figure 19:
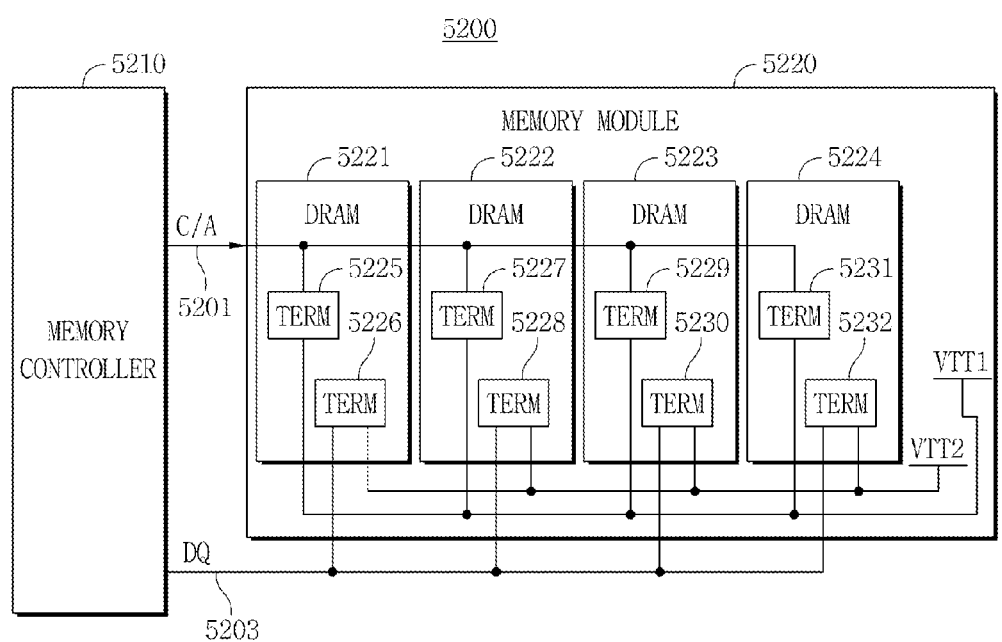
FIG. 19 is a block diagram of a memory system in accordance with another example embodiment of the inventive concepts.

FIG. 19 is a block diagram of a memory system 5200 in accordance with another example embodiment of the inventive concepts.

Referring to FIG. 19, the memory system 5200 generally includes a memory controller 5210 and a memory module 5220.

The memory controller 5210 generates a command/address signal C/A and a data signal DQ. The memory module 5220 operates in response to the command/address signal C/A and the data signal DQ. A plurality of semiconductor memory devices 5221, 5222, 5223 and 5224 are mounted on the memory module 5220. Each of the semiconductor memory devices 5221, 5222, 5223 and 5224 has a termination circuit 5225, 5227, 5229 or 5231 for a command/address bus 5201 through which the command/address signal C/A is transmitted. The command/address signal C/A may be packet data in which a command signal and an address signal are coupled in a packet form. Further, each of the semiconductor memory devices 5221, 5222, 5223 and 5224 includes a termination circuit 5226, 5228, 5230 or 5232 for a data bus 5203 through which a data signal DQ is transmitted.

The memory module 5220 having four semiconductor memory devices is shown in FIG. 19, but the memory module 5220 may have two semiconductor memory devices or more. Further, semiconductor memory devices may be mounted on both sides of a substrate of the memory module 5220.

The data signal DQ is transmitted or received between the memory controller 5210 and the semiconductor memory devices 5221, 5222, 5223 and 5224 constituting the memory module 5220 through a data bus 5203.

The command/address bus 5201 has the fly-by structure, and electrically connects the semiconductor memory devices 5221, 5222, 5223 and 5224 to each other. Further, each of the termination circuit 5225, 5227, 5229 and 5231 included in the semiconductor memory devices 5221, 5222, 5223 and 5224 is coupled between the command/address bus 5201 and a first termination voltage VTT1, and changes a termination resistance of the command/address bus 5201. Further, each of the termination circuit 5226, 5228, 5230 and 5232 included in the semiconductor memory devices 5221, 5222, 5223 and 5224 is coupled between the data bus 5203 and a second termination voltage VTT2, and changes a termination resistance of the data bus 5203.

The first termination voltage VTT1 is provided to each of the termination circuits 5225, 5227, 5229 and 5231, and the second termination voltage VTT2 is provided to each of the termination circuits 5226, 5228, 5230 and 5232.

Figure 20:
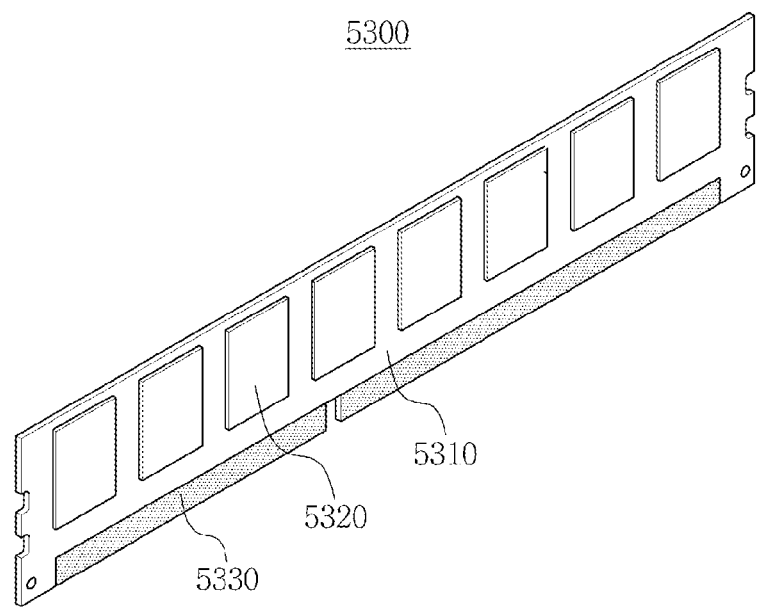
FIGS. 20 to 22 are respective diagrams illustrating memory modules including at least one semiconductor memory device in accordance with example embodiment of the inventive concepts.
Figure 21:
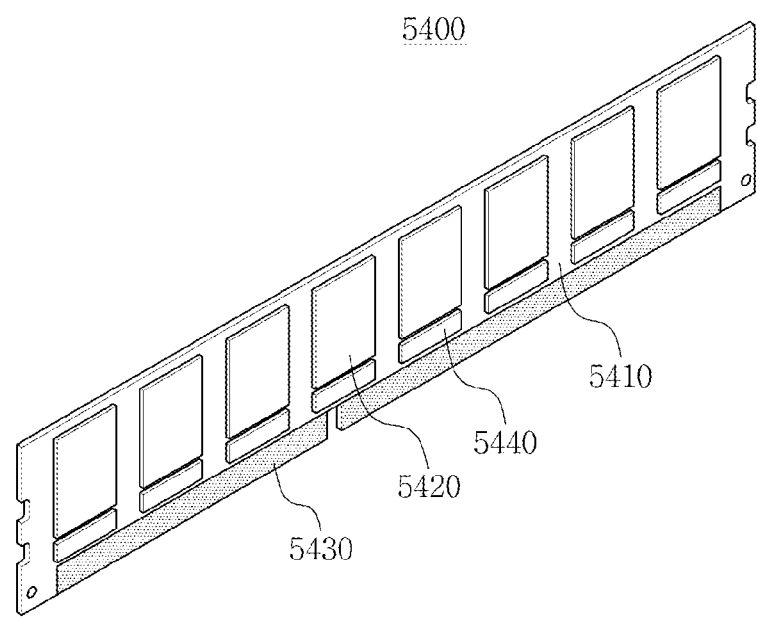
Figure 22:
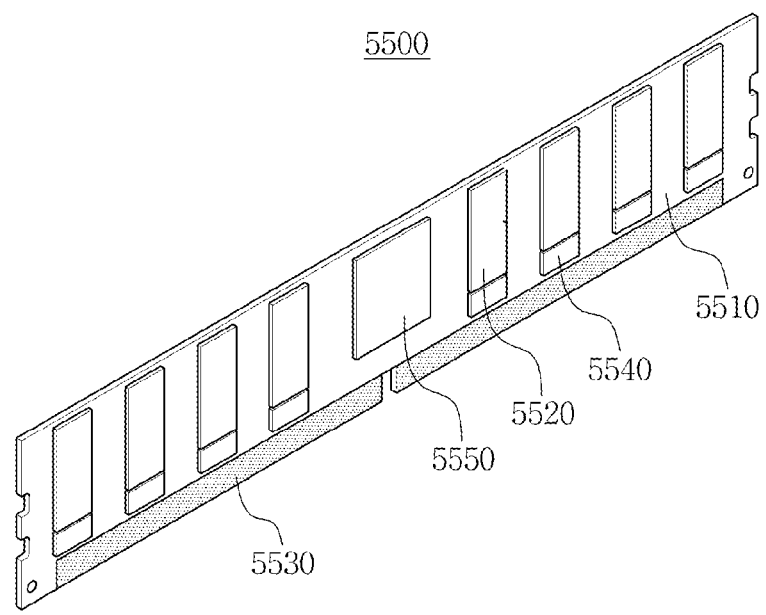

FIGS. 20 to 22 are respective diagrams illustrating memory modules including at least one semiconductor memory device in accordance with example embodiments of the inventive concepts.

Referring to FIG. 20, the memory module 5300 may include a printed circuit board (PCB) 5310, a plurality of semiconductor memory devices 5320, and a connector 5330. The plurality of semiconductor memory devices 5320 may be bonded to top and bottom surfaces of the PCB 5310. The connector 5330 may be electrically connected to the plurality of semiconductor memory devices 5320 through conductive lines (not shown). Also, the connector 5330 may be connected to a slot of an external host.

Referring to FIG. 21, the memory module 5400 may include a PCB 5410, a plurality of semiconductor memory devices 5420, a connector 5430, and a plurality of buffers 5440. Each of the plurality of buffers 5440 may be disposed between the corresponding one of the semiconductor memory devices 5420 and the connector 5430.

The semiconductor memory devices 5420 and the buffers 5440 may be provided on top and bottom surfaces of the PCB 5410. The semiconductor memory devices 5420 and the buffers 5440 formed on the top and bottom surfaces of the PCB 5410 may be connected through a plurality of via holes.

Referring to FIG. 22, the memory module 5500 may include a PCB 5510, a plurality of semiconductor memory devices 5520, a connector 5530, a plurality of buffers 5540, and a controller 5550.

The semiconductor memory devices 5520 and the buffers 5540 may be provided on top and bottom surfaces of the PCB 5510. The semiconductor memory devices 5520 and the buffers 5540 formed on the top and bottom surfaces of the PCB 5510 may be connected through a plurality of via holes.

Figure 23:
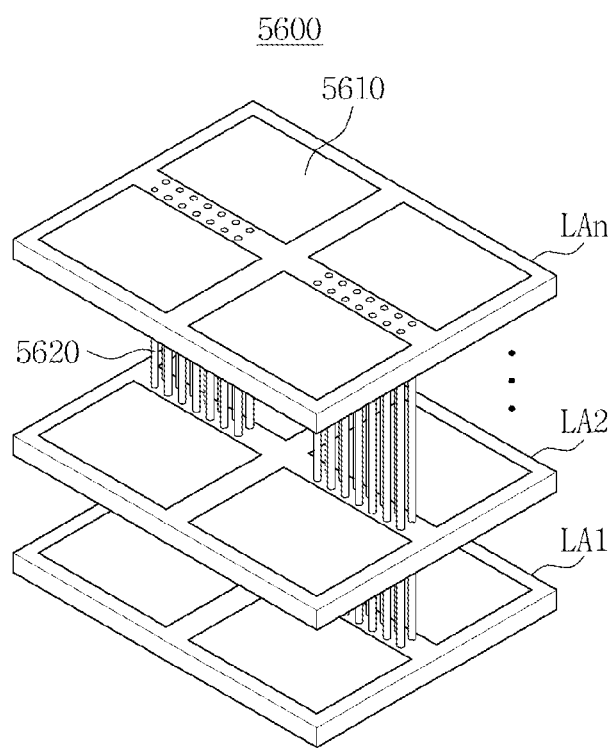
FIG. 23 is a perspective diagram illustrating a stacked semiconductor device including at least one semiconductor memory device in accordance with example embodiment of the inventive concepts.

FIG. 23 is a perspective diagram illustrating a stacked semiconductor device including at least one semiconductor memory device in accordance with example embodiments of the inventive concepts. In the memory modules of FIGS. 20 to 22, each of the semiconductor memory devices may include a plurality of semiconductor layers LA1 to LAn.

In the stacked semiconductor device 5600, the plurality of stacked semiconductor layers LA1 to LAn may be connected to one another through through-silicon vias (TSVs) 5620.

Figure 24:
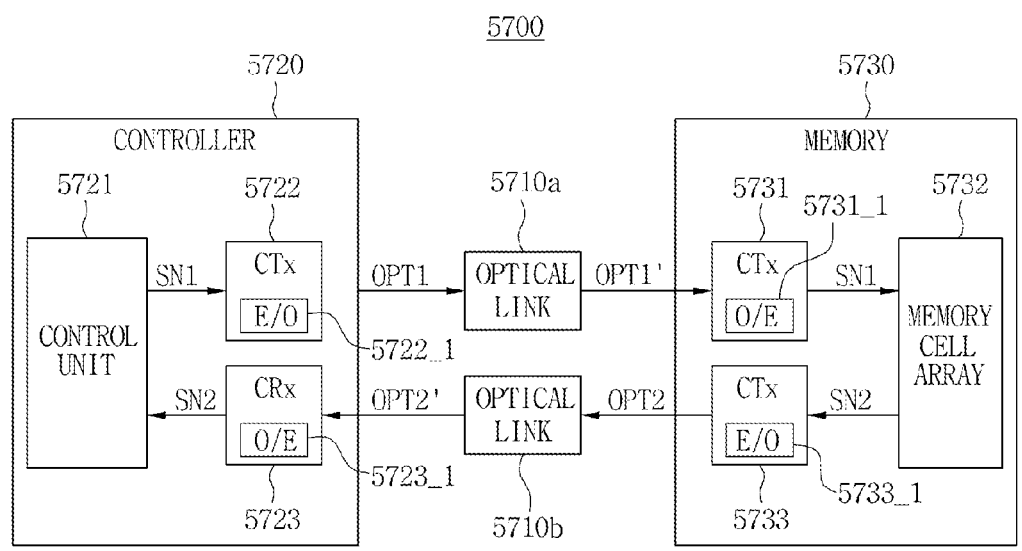
FIG. 24 is a block diagram of a memory system including at least one semiconductor memory device configured with an optical connection according to example embodiment of the inventive concepts.

FIG. 24 is a block diagram of a memory system 5700 including at least one semiconductor memory device configured with an optical connection according to example embodiments of the inventive concepts.

Referring to FIG. 24, the memory system 5700 may include a controller 5720, a semiconductor memory device 5730, and a plurality of optical links 5710a and 5710b configured to interconnect the controller 5720 and the semiconductor memory device 5730. The controller 5720 may include a control unit 5721, a first transmitter 5722, and a first receiver 5723. The control unit 5721 may transmit a control signal SN1 to the first transmitter 4622.

The first transmitter 5722 may include a first optical modulator 5722_1, which may convert the control signal SN1, which is an electric signal, into a first optical transmission signal OPT1, and transmit the first optical transmission signal OPT1 to the optical link 5710a.

The first receiver 5723 may include a first optical demodulator 5723_1, which may convert a second optical receiving signal OPT2' received from the optical link 5710b into a data signal SN2, which is an electric signal, and transmit the data signal SN2 to the control unit 5721.

The MRAM device 5730 may include a second receiver 5731, a memory cell array 5732, and a second transmitter 5733. The second receiver 5731 may include a second optical modulator 5731_1, which may convert a first optical receiving signal OPT1' received from the optical link 5710A into the control signal SN1, which is the electric signal, and transmit the control signal SN1 to the memory cell array 5732.

In the memory cell array 5732, data may be written under the control of the control signal SN1, or the data signal SN2 output from the memory cell array 5732 may be transmitted to the second transmitter 5733.

The second transmitter 5733 may include a second optical modulator 5733_1, which may convert the data signal SN2, which is the electric signal, into a second optical data signal OPT2, and transmit the second optical data signal OPT2 to the optical link 5710b.

Figure 25:
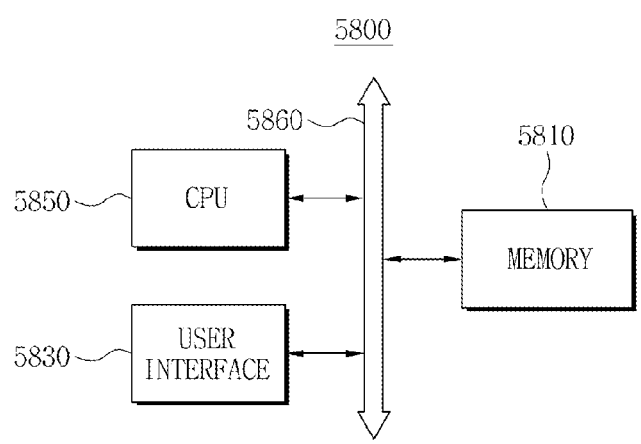
FIG. 25 is a general block diagram of an information processing system including at least one semiconductor memory device according to certain example embodiment of the inventive concepts.

FIG. 25 is a general block diagram of an information processing system 5800 including at least one semiconductor memory device according to certain example embodiments of the inventive concepts.

Referring to FIG. 25, a semiconductor memory device 5810 may be mounted in a computational system 5800, such as a mobile device or a desktop computer. The computational system 5800 may include a semiconductor memory device 5810, a CPU 5850, and a user interface 5830, which may be electrically connected to a system bus 5860.

Each of the memory devices 5300, 5400, 5500, 5600, 5700 and 5810 may include an on-die termination (ODT) circuit configured to adjust a termination resistance of a bus.

Example embodiments of the inventive concepts may be applied to a semiconductor device, and a system including the semiconductor device.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of the example embodiments of the inventive concepts as defined in the claims.

What is claimed is:

1. An on-die termination (ODT) circuit, comprising:
   a system environment detector configured to,
   detect a supply voltage to generate a voltage code,
   detect an operating temperature to generate a temperature rode, and
   detect an operating frequency to generate a frequency code;
   an on-chip driver (OCD)/ODT replica circuit configured to generate a pull-up reference voltage and a pull-down reference voltage;
   an OCD/ODT code generator configured to,
   generate an initial code based on the pull-up reference voltage, the pull-down reference voltage, the voltage code, the temperature code and the frequency code, and
   generate a pull-up code and a pull-down code based on the initial code, the voltage code, the temperature code and the frequency code; and
   an OCD/ODT circuit configured to change ODT resistance based on the pull-up code and the pull-down code.

2. The ODT circuit of claim 1, wherein the system environment detector comprises:
   a voltage detecting circuit configured to detect the supply voltage to generate the voltage code;
   a temperature detecting circuit configured to detect the operating temperature to generate the temperature code; and
   a frequency detecting circuit configured to detect the operating frequency to generate the frequency code.

3. The ODT circuit of claim 2, wherein the voltage detecting circuit comprises:
   a reference voltage generator configured to generate a first reference voltage and a second reference voltage;
   a voltage divider configured to divide the supply voltage to generate a first voltage,
   a first comparator configured to generate a first comparison output voltage based on the first voltage and the first reference voltage;
   a second comparator configured to generate a second comparison output voltage based on the first voltage and the second reference voltage; and
   a decoder configured to decode the first comparison output voltage and the second comparison output voltage to generate the voltage code.

4. The ODT circuit of claim 3, wherein
   the voltage code includes a first voltage, a second voltage code, and a third voltage code, the first voltage code has a voltage level greater than a first supply voltage, the second voltage code has a voltage level greater than or equal to a second supply voltage and smaller than or equal to the first supply voltage, and the third voltage code has a voltage level smaller than a second supply voltage.

5. The ODT circuit of claim 2, wherein the temperature detecting circuit comprises:
a band-gap reference circuit configured to generate a first sense signal having a voltage level proportional to an absolute value of the operating temperature and a second sense signal having a voltage level inversely proportional to the absolute value;
a first current-controlled oscillator configured to generate a first clock signal based on the first sense signal;
a second current-controlled oscillator configured to generate a second clock signal based on the second sense signal;
a first counter configured to count the second clock signal to generate a selection signal; and
a second counter configured to count the first clock signal to generate the temperature code in response to the selection signal.

6. The ODT circuit of claim 5, wherein the first current controlled oscillator comprises:
a voltage-current converter configured to generate a first current signal corresponding to the first sense signal; and
an oscillator configured to generate the first clock signal such that the first clock signal oscillates in response to the first current signal.

7. The ODT circuit of claim 5, wherein the second current-controlled oscillator comprises:
a voltage-current converter configured to genes ale a second current signal corresponding to the second sense signal; and
an oscillator configured to generate the second clock signal such that the second clock signal oscillates in response to the second current signal.

8. The ODT circuit of claim 2, wherein the frequency detecting circuit comprises:
a frequency divider configured to frequency-divide a first clock signal to generate a second clock signal;
a gated oscillator configured to generate a third clock signal based on the second clock signal; and
a counter and decoder configured to count and decode the third clock signal to generate the frequency code.

9. The ODT circuit of claim 1, wherein the OCD/ODT code generator comprises:
an OCD/ODT code generating unit configured to,
generate the initial code based on the pull-up reference voltage, the pull-down reference voltage, the voltage code, the temperature code and the frequency code, and
generate the pull-up code and the pull-down code based on an adjusted code; and
a code adjusting circuit configured to,
generate the adjusted code based on the initial code, the voltage code, the temperature code and the frequency code, and
provide the adjusted code to the OCD/ODT code generating unit.

10. The ODT circuit of claim 9, wherein the code adjusting circuit comprises:
an adder configured to add the initial code and a compensation code to generate a first output signal;
a subtractor configured to subtract the initial code from the compensation code to generate a second output signal; and
a selecting circuit configured to,
select one of the first output signal and the second output signal in response to the voltage code, the temperature code and the frequency code, and
output the selected signal as the adjusted code.

11. The ODT circuit of claim 9, wherein the code adjusting circuit comprises:
a plurality of code registers configured to store stored values therein, the stored values being sequentially offset by a number from the initial code; and
a selecting circuit configured to select one of the output signals of the code registers in response to the voltage code, the temperature code and the frequency code, and output the selected signal as the adjusted code.

12. The ODT circuit of claim 1, wherein the OCD/ODT code generator comprises:
an OCD/ODT code generating unit configured to generate the initial code based on the pull-up reference voltage, the pull-down reference voltage, the voltage code, the temperature code and the frequency code; and
a code adjusting circuit configured to generate the pull-up code and the pull-down code based on the initial code, the voltage code, the temperature code and the frequency code.

13. An on-die termination (ODT) circuit, comprising:
a system environment detector configured to,
detect a supply voltage to generate a voltage code,
detect an operating temperature to generate a temperature code, and
detect an operating frequency to generate a frequency code;
an on-chip driver (OCD)/ODT replica circuit configured to generate a pull-up reference voltage and a pull-down reference voltage;
an OCD/ODT code generator configured to generate a pull-up code and a pull-down code based on the pull-up reference voltage, the pull-down reference voltage, the voltage code, the temperature code and the frequency code;
an OCD/ODT circuit configured to change ODT resistance in response to the pull-up code and the pull-down code;
an input/output (I/O) pad connected to the OCD/ODT unit, the I/O pad configured to generate a first input;
a reference voltage generator configured to generate a reference voltage based on the voltage code, the temperature code and the frequency code; and
a comparator configured to generate a second input signal based on the first input and the reference voltage.

14. The ODT circuit of claim 13, wherein the second input signal includes one or more of data, an address and a command.

15. The ODT circuit of claim 13, wherein the reference voltage generator is configured to change a voltage level of the reference voltage based on a swing level of output data when an ODT resistance of the ODT circuit is changed.

16. An on-die termination (ODT) circuit configured to compensate for impedance mismatch and increase a driving capability of a data signal by providing a termination impedance based on the impedance mismatch, the ODT circuit comprising:
one or more detector circuits configured to detect one or more environmental conditions of the ODT circuit;
an input/output (I/O) pad configured to receive or transmit the data signal; and a control circuit configured to adjust the termination impedance based on the environmental conditions by,
generating an initial code based reference voltages and the one or more environmental conditions,
generating a pull-up code and a pull-down code based on the initial code and the one of more environmental conditions, and
adjusting the termination impedance based on the pull-up code and the pull-down code.

17. The ODT circuit of claim 16, wherein the environmental conditions include a supply voltage, an operating temperature, and an operating frequency.

18. The ODT circuit of claim 16, wherein the control circuit comprises:
a code generator configured to generate the pull-up code and the pull-down code based on the reference voltages and the environmental conditions.

19. The ODT circuit of claim 18, wherein the control circuit further comprises:
an impedance adjusting device configured to selectively connect the I/O pad to a pull up circuit and a pull down circuit based on the pull-up code, the pull-down code and the data signal.

20. The ODT circuit of claim 16, wherein
the I/O pad is coupled to one or more of an internal bus line and an external bus line, and
the control circuit is configured to change a termination resistance of one or more of the internal bus line and the external bus line based on the environmental conditions.

* * * * *